United States Patent [19]

Martin

[11] 3,908,185

[45] Sept. 23, 1975

[54] HIGH FREQUENCY SEMICONDUCTOR DEVICE HAVING IMPROVED METALLIZED PATTERNS

[75] Inventor: Irving Edwin Martin, Somerville, N.J.

[73] Assignee: RCA Corporation, New York, N.Y.

[22] Filed: Mar. 6, 1974

[21] Appl. No.: 448,697

[52] U.S. Cl. ...................... 357/74; 357/68; 357/70; 357/80; 357/81; 357/84; 333/84 M

[51] Int. Cl.$^2$ .................... H01L 23/02; H01L 23/12

[58] Field of Search ............. 357/74, 68, 80, 81, 82, 357/84, 70; 333/84 M

[56] References Cited

UNITED STATES PATENTS

| | | | |
|---|---|---|---|
| 3,626,259 | 12/1971 | Garboushian | 357/82 |
| 3,651,434 | 3/1972 | McGeough et al. | 357/82 |
| 3,681,513 | 8/1972 | Hargis | 357/81 |
| 3,713,006 | 1/1973 | Litty et al. | 357/74 |
| 3,715,635 | 2/1973 | Michel et al. | 357/74 |
| 3,748,544 | 7/1973 | Noren | 357/74 |
| 3,838,443 | 9/1974 | Laighton | 357/84 |

*Primary Examiner*—Andrew J. James
*Attorney, Agent, or Firm*—H. Christoffersen; M. Y. Epstein

[57] ABSTRACT

An apertured top ceramic member is mounted on a bottom ceramic member, the latter member having a first metallized area thereon on which a semiconductor chip is mounted and a second surrounding metallized area connected to the ground terminal of the device. A large gap is provided between portions of the first and second areas, the size of this gap affecting various characteristics of the device. Also, metallized areas are provided on the apertured member in overlapped but spaced apart relation with portions of the second area on the bottom member, the amount of overlap of these metallized areas affecting various capacitances of the device.

10 Claims, 7 Drawing Figures

HIGH FREQUENCY SEMICONDUCTOR DEVICE HAVING IMPROVED METALLIZED PATTERNS

This invention relates to high frequency semiconductor devices, and particularly to the package of such devices.

At high frequencies, the physical characteristics of the package in which the semiconductor chip or wafer is housed significantly affect the electrical performance of the semiconductor device. The parasitic impedances of the package, for example, significantly affect such device characteristics as the input and output impedances, the device operating bandwith, and the level of feedback between the device input and output. The control and/or minimizing of package parasitic impedances is thus of major importance in the design of such high frequency devices, and this invention is directed towards these ends.

While not limited thereto, the present invention has particular utility in devices of the type shown in U.S. Pat. No. 3,651,434, issued on Mar. 21, 1972 to P. McGeough, et al. the disclosure of said patent being incorporated herein.

Figure 1:
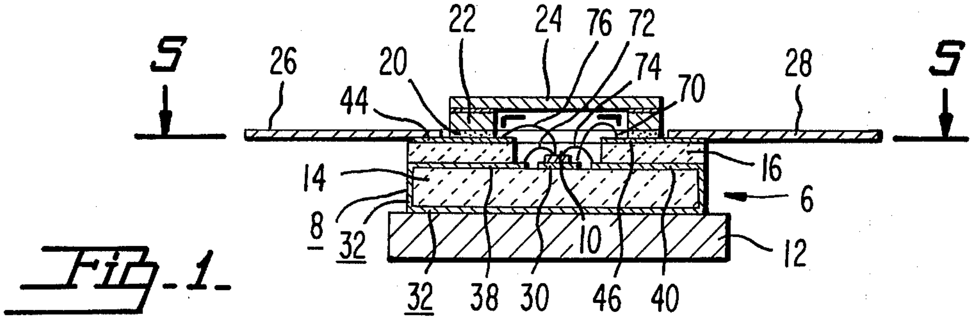
FIG. 1 is a cross-sectional view of a device made in accordance with the instant invention.

As shown in FIG. 1, a semiconductor device 6 in accordance with this invention comprises a package 8 and a semiconductor pellet 10 housed therewithin. The package 8 comprises a header 12 of, for example, copper, a support member 14 of, for example, beryllia (BeO), an annular spacer member 16 of, for example, alumina ($Al_2O_3$), a sealing ring 20 of, for example, a high temperature glass, a sealing washer 22 of, for example, aluminum, and a cap 24 of, for example, stainless steel. Input and output leads 26 and 28, respectively, are secured to separate metallized areas, to be described, on the upper surface of the spacer member 16.

The illustrative device 6 is a power amplifier transistor having three terminals, namely the input and output leads 26 and 28, respectively, and the header 12. In use of the device 6, the header terminal 12 is generally connected to the circuit ground.

To the extent so far described, the device 6 can be substantially identical to the device shown in the aforecited patent. Also, the assembly of the device, including the mounting and interconnecting of the semiconductor chip 10 therewithin, can be as disclosed in said patent. While not shown herein, the invention also has particular utility in devices of the type shown in U.S. Pat. No. 3,748,544, issued July 24, 1973 to S. Noren.

Figures 2, 6:
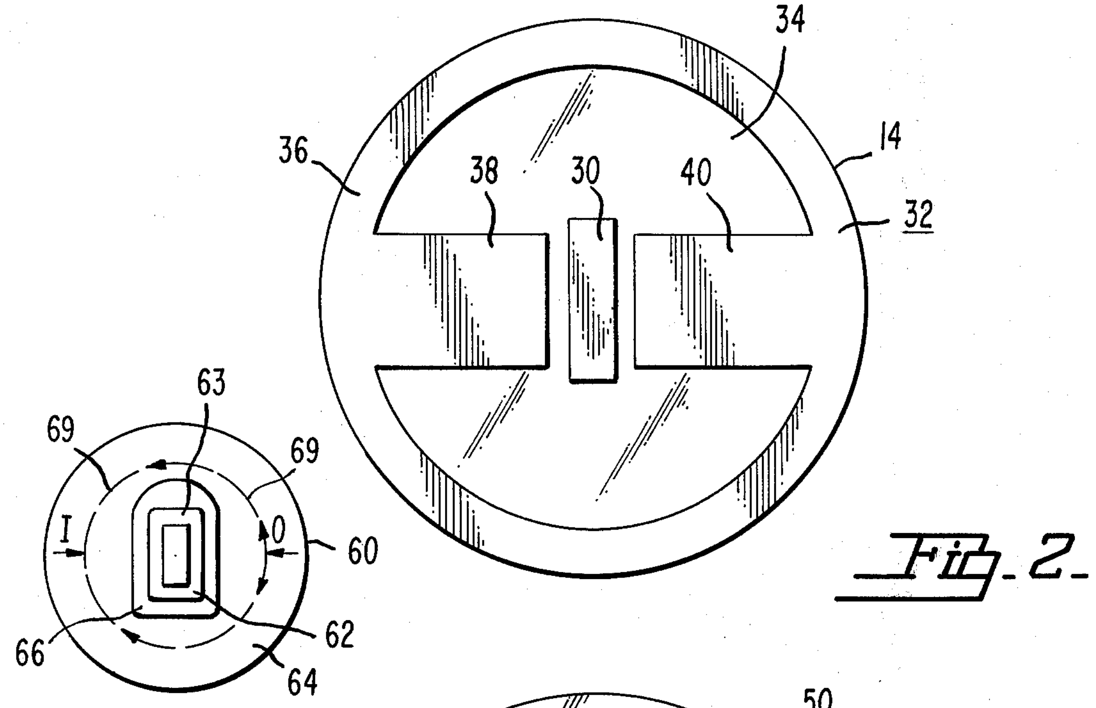
FIG. 2, FIG. 6 PRIOR ART
FIG. 2 is a top view, on an enlarged scale, of one of the parts of the package of the device shown in FIG. 1.
FIG. 6 is a top view of a part used in a prior art device, this part being generally similar to the part shown in FIG. 2 herein.

As shown in FIGS. 1 and 2, the support member 14 is partially coated with a layer of metal, e.g., gold plated copper, the layer being divided or patterned into two main conductive portions 30 and 32. The portion 30 comprises a comparatively small area disposed centrally of the upper surface 34 of the support member 14. The portion 32 covers the entire bottom surface (see FIG. 1) of the member 14, covers the side surface thereof, and, on the upper surface 34, includes an annular peripheral segment 36 having two extensions 38 and 40 projecting inwardly towards the portion 30.

Figure 3:
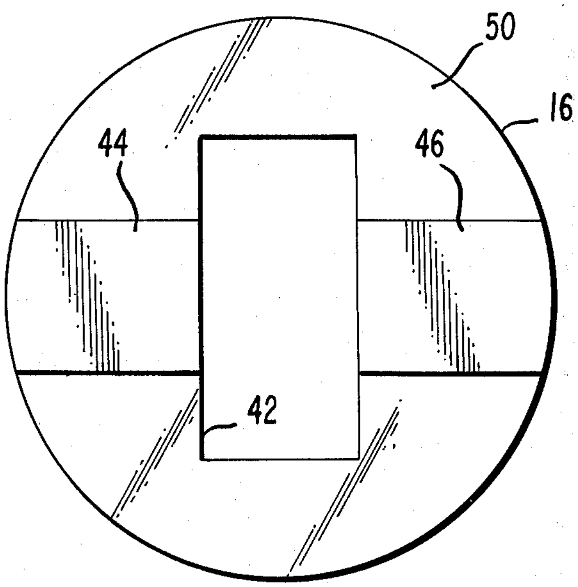
FIGS. 3 and 4 are top and bottom views, respectively, of another part of the device shown in FIG. 1.
Figure 4:
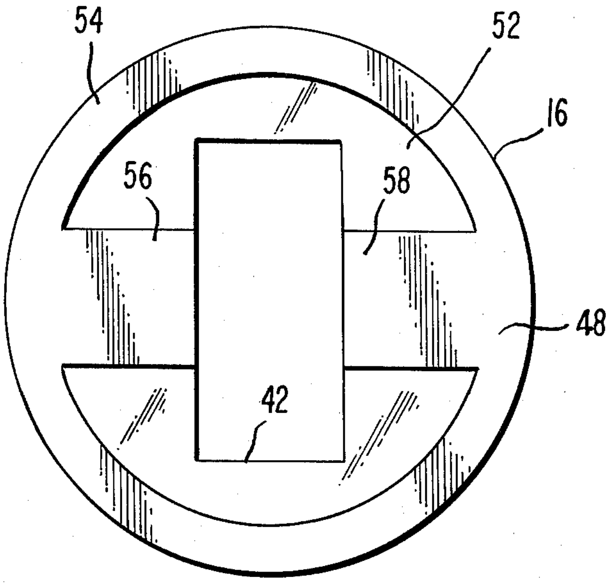

The annular spacer member (FIGS. 1, 3 and 4) has a centrally located window 42 therethrough, and a metal layer thereon patterned into three separate conductive portions. Two portions 44 and 46 (FIG. 3) of the metal layer are disposed on the upper surface 50 of the spacer member 16, each of these portions being of a generally rectangular shape (with one curved side), and each portion extending from the outer peripheral edge of the member 16 to the edge of the window 42. The third portion 48 (FIG. 4) of the metal layer on the spacer member 16 is disposed on the lower surface 52 thereof, this portion 48 including an annular peripheral segment 54 having two extensions 56 and 58 projecting inwardly to the edge of the window 42. The extensions 56 and 58 on the lower surface 52 of the member 16 are generally aligned with but are of a smaller width than the extensions 44 and 46, respectively, on the upper surface 50 thereof, the extensions 56 and 58 being of the same width as the extensions 38 and 32, respectively, on the support member 14.

In the assembled device, as shown in FIG. 1, the metallized lower surface of the support member 14 is brazed to the header 12, and the metallized pattern on the lower surface 52 (FIG. 4) of the spacer member 16 is aligned with and brazed to the metallized pattern on the upper surface 34 (FIG. 2) of the support member 14.

Figure 5:
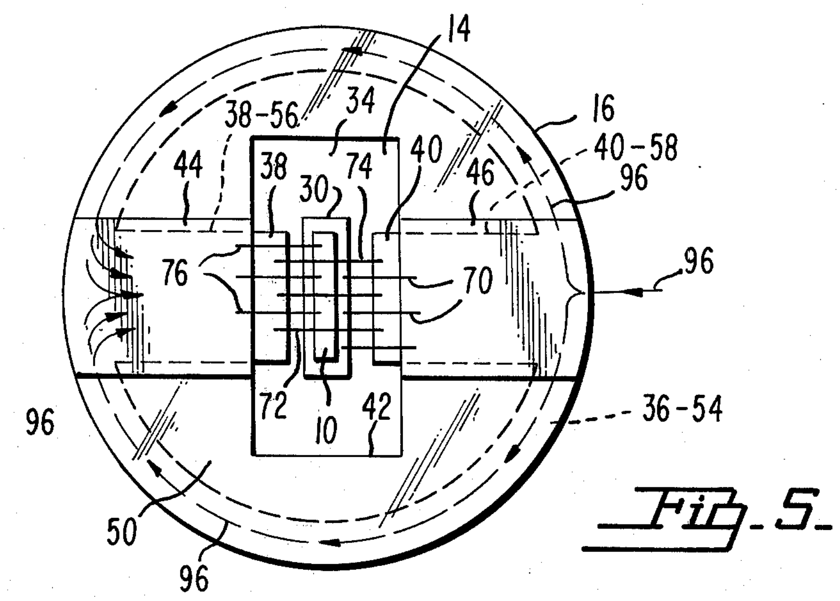
FIG. 5 is a sectional view taken along line 5—5 of FIG. 1.

The alignment of the metallized patterns on the members 14 and 16 is shown in FIG. 5. The peripheral metallized segments 36 and 54 on the contacting surfaces of the members 14 and 16, respectively, align with one another (and, where appropriate, are hereinafter referred to jointly as the segments 36–54), and the side edges of the extensions 56 and 58 (FIG. 4) on the lower surface 52 of the member 16 likewise align with the side edges of the extensions 38 and 40, respectively (FIG. 2), on the upper surface 34 of the member 14. The extensions 44 and 46 (FIG. 3) on the upper surface 50 of the member 16 are thus in general alignment with the extensions 38 and 40, but they slightly overlap (see FIG. 5) the side edges thereof. The metallized extensions 38 and 40 on the support member 14 are longer than the various metallized extensions on the spacer member 16 and extend into the space defined or overlapped by the window 42 through the member 16. Since the extensions 38 and 40 on the member 14 are brazed to the extensions 56 and 58, respectively, on the member 16, reference hereinafter to either segment 38 or 40 is meant to also include reference to either segment 56 or 58, respectively.

The patterns of surface metallizations on the members 14 and 16 are different from the metallized patterns used in the device shown in the aforecited patent. For example, in the patented device, a support member 60 (FIG. 6) is used which is quite similar to the support member 14 (FIG. 2) used in the inventive device 6, the member 60 including a central metallized portion 62, on which a semiconductor chip 63 is mounted, and a surrounding metallized portion 64. As shown in FIG. 6, except for a small gap 66 between the metallized portions 62 and 64, the metallized portion 64 covers all the surface of the member 60 not covered by the central portion 62. On the support member 14 used in the inventive device 6, however, the surrounding metallized portion 32 (FIG. 2) leaves exposed a substantial portion of the surface 34 of the member.

Returning to the description of the illustrative device 6, a semiconductor pellet 10 (FIGS. 1 and 5) of known type, e.g., a plural cell power amplifier transistor such as that shown in U.S. Pat. No. 3,713,006 issued on Jan. 23, 1973, is mounted, as by brazing, on the metallized portion 30 on the support member 14, the collector regions of the various transistor cells within the pellet 10 being electrically connected to the portion 30 through the bottom surface of the pellet.

The illustrative device 6 is of the grounded, or common, base region type, and to this end, the collector regions of the device are connected (FIGS. 1 and 5) to the device output lead 28 by means of bond wires 70 extending between and electrically connected to, as by ultrasonic welding, the metallized portion 30 on the support member 14 and the metallized extension 46 on the spacer member 16. The base regions of the various transistor cells are electrically connected to the extensions 38 and 40 on the support member 14 by means of bond wires 72 and 74, respectively. The base regions are thus electrically connected to the header 12 via the metallized portion 32, the header 12 generally being connected to the ground of the circuit in which the device 6 is used.

The emitter regions of the transistor cells are individually connected to the extension 44 on the spacer member 16, and thus to the input lead 26 brazed thereto, by means of bond wires 76.

Figure 7:
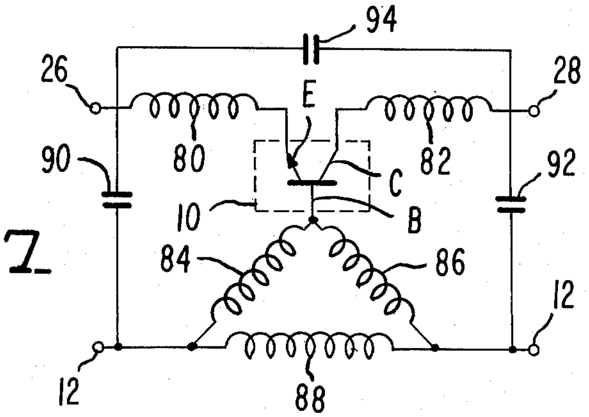
FIG. 7 is an equivalent circuit of the device shown in FIG. 1.

An equivalent circuit of the device 6 is shown in FIG. 7. The inductance associated with the emitter bond wires 76 and the input lead 26 is shown in FIG. 7 as a lumped inductance 80. Similarly, the inductance associated with the collector lead wires 70 and the output lead 28 is shown as an inductance 82.

The inductance associated with the base region of the transistor chip 10 provides a "delta" inductive circuit by virtue of the grounded base or common base configuration of the device 6. That is, the inductance associated with the lead wires 72 connected between the transistor base region and the metallized extension 38 (FIG. 5), along with the inductance of the extension 38, is shown in FIG. 7 as an inductance 84. Similarly, the inductance associated with the lead wires 74 and the metallized extension 40 is shown as an inductance 86. As shown in FIG. 2, the metallized extensions 38 and 40 on the support member 14 are joined by an annular metallized segment 36. The inductance of this segment 36, as well as the inductance of the metallized portion 32 covering the narrow side surface and the bottom surface of the member 14, are shown as an inductance 88 connected between the ends of the inductances 84 and 88.

The package 8 also includes various parasitic capacitances. These capacitances are represented by a capacitor 90 between the input terminal 26 and the common or ground terminal 12, a capacitor 92 between the output terminal 28 and the ground terminal 12, and a capacitor 94 between the input terminal 26 and the output terminal 28.

The significance of the particular metallization patterns used in the device 6 is as follows.

The input capacitance, represented by the capacitor 90 in FIG. 7, is determined to a great extent by the size and spatial relationship of the metallized segment 44 (the input metallization) on the spacer member 16 and the metallized segment 38 (the common or ground metallization) on the support member 14, the two segments 38 and 44 being, in effect, the plates of a capacitor separated by a dielectric constituted by the spacer member 16. For a metallization 44 of given width, determined, frequently, by the amount of space required by the lead wires 76 (FIG. 5) bonded thereto, the input capacitance, and thus the input impedance of the device, can be controlled to some extent by the design of the width of the ground metallization 38 (along with the metallization 56 brazed thereto). As shown in FIG. 5, for example, the ground metallization segment 38 is of a smaller width than the input metallization segment 44. Similarly, the output capacitance, and thus the output impedance, can be controlled to some extent by the design of the width of the ground metallizations 40–58. The fact that the ground metallization extension can be designed with varying widths provides greater flexibility in the design of such devices than is available in devices designed in accordance with the teaching of the aforecited McGeough et al., patent.

For example, in accordance with the patent disclosure, in order to minimize the capacitance between the input and output terminals, represented by the capacitor 94 shown in FIG. 7, the ground metallization 64 (FIG. 6) on the support member 60 must be wider, at the edge of the window through the spacer member, than the input metallization on the spacer member. This required relationship between the width of the two metallized areas reduces the flexibility of the design with respect to obtaining low input capacitances. I discovered, however, that, at least up to frequencies in the order of 3.0 ghz, the use of a ground metallization 38 on the support member 14 of less width than the input metallization 44 on the spacer member 16 provided no measurable differences in input to output capacitance as compared with otherwise substantially identical devices made in accordance with the aforecited patent.

As shown in FIG. 7, the "input" circuit of the device 6 includes the inductance 80, the emitter to base portion of the transistor 10, the inductance 84, and the capacitor 90. The "output" circuit includes the inductance 82, the collector to base portion of the transistor 10, the inductance 86, and the capacitor 92. Aside from the base region of the transistor itself, two feedback paths exist between the input and output circuits, namely the capacitor 94 and the inductance 88.

As previously described, the inductance 88 represents the inductance associated with the metallized portion 32 on the member 14, the magnitude of the inductance thereof being a function of, among other things, the length and width of the annular segments 36–54 of the two members 14 and 16. Thus, for a device package 8 of given size and materials, the inductance of the feedback inductance 88 can be varied within some limits by varying the dimensions of the annular segments 36–54. Indeed, in some instances, the annular segments 36–54 can be entirely omitted. Again, this provides greater flexibility in the design of the inventive devices than is possible in accordance with the teachings of the aforecited patent wherein, as shown in FIG. 6, the ground metallization 64 is made as extensive as possible.

As generally known, feedback from the output to the input circuit affects the driving and loading of the semiconductor chip, i.e., the feedback signal combines with the input signal applied to the device. One problem with the prior art device shown in the aforecited patent is that the ground current feedback paths between the portion O (FIG. 6) of the metallization 64 connected to the output circuit and the portion I thereof connected to the input circuit are not of equal lengths with respect to different points on the semiconductor chip 63. That is, as shown in FIG. 6, the paths for feedback currents between the input and output portions of the metallization 64 are along the dashed lines 69 around the gap 66 between the portions 62 and 66. Along the long axis of the semiconductor chip 63, however, these feedback paths are longer for central portions of the chip 63 than for end portions thereof, and the feedback signal applied to the chip 63 thus varies along its length. This non-uniform feedback can cause nonuniform driving and loading of the semiconductor chip.

In the inventive devices, as shown in FIG. 5, the ground current feedback paths, as indicated by the dashed arrowed lines 96, are first through the annular segments 36–54 and then through the extension 38 to the various lead wires 76. Owing to the comparatively long current path lengths through the annular segments 36–54, which feed into the outer end of the extension 38, any variation in path lengths from point to point along the long axis of the chip 10 is quite minimal.

The long current feedback paths are obtained by providing the gap or space in the ground metallization 32 (FIG. 2). This gap results in the shortest current paths between the segments 38 and 40 through the annular segment 36 being substantially longer than the shortest paths between the segments 38 and 40 around the conductive area 30, such latter paths being those substantially available for the feedback currents in the prior art devices, as shown in FIG. 6.

As will be apparent to persons skilled in these arts, other metallization patterns, including gaps for increasing the current feedback path lengths and the feedback inductance, are possible. For example, by changing the shape of and increasing the width of the peripheral segment 36 (FIG. 2) so that its inner edge is quite close to and parallel to the side edges of the segments 38 and 40, the feedback inductance is reduced, while the current feedback path lengths, with respect to the uniformity of driving the semiconductor wafer, are not significantly altered.

Alternately, by greatly increasing the width of the extension 38 and thus greatly reducing the length of the narrow peripheral segment 36, the feedback inductance is reduced. Also, provided the shortest distances between the semiconductor wafer 10 and the points of juncture between the extension 38 and the peripheral segment 36 are substantially greater than the length of the semiconductor wafer (e.g., more than three times greater), substantially uniform current feedback lengths are attained.

What is claimed is:

1. A semiconductor device comprising:

an insulating member having a first conductive area on a surface thereof, and a second conductive area on said member in generally spaced apart, surrounding relation with said first conductive area, a semiconductor pellet mounted on said first area, and first and second conductive means electrically connecting portions of said pellet to different portions of said second area, the paths for current between said different portions through said second area being of substantially uniform length by virtue of the shortest paths for said current through said second area being substantially longer than the shortest paths between said different portions along surfaces of said member not intersecting said first area.

2. A device as in claim 1 wherein said first area is mounted centrally of said surface, said different portions of said second area comprise segments extending towards one another and towards said first area from the periphery of said surface, and said current paths enter said segments only from the peripherally disposed portions thereof.

3. A semiconductor device as in claim 2 in which said second area includes an annular segment disposed along the periphery of said surface from which said segments extend, said annular segment providing the shortest current paths on said surface between said different portions.

4. A semiconductor device as in claim 3 in which the shortest distances between said pellet and the points of juncture of one of said extending segments with said annular segment are substantially greater than the length of said pellet.

5. A semiconductor device comprising:

a first insulating member having first and second oppositely disposed surfaces, and a second insulating member having third and fourth oppositely disposed surfaces, said members being in second to third surface containing relation, first and second spaced apart conductive areas on said first surface of said first member, third and fourth spaced apart conductive areas on said third surface of said second member, said fourth area including first and second portions in generally aligned relation with said first and second areas, respectively, on said first surface, and spaced from said third conductive area by preselected spacings, a gap in said fourth area resulting in the shortest paths for current between said first and second portions through said fourth conductive area being substantially longer than the shortest paths therebetween on said third surface which do not intersect said first area.

6. A semiconductor device as in claim 5 wherein said fourth area includes an annular segment disposed along the periphery of said third surface, said two portions of said fourth area being in the form of elongated segments extending inwardly from said annular segment towards said third conductive area.

7. A semiconductor device as in claim 6 wherein one of said portions of said fourth conductive area is of less width than the corresponding aligned one of said first and second conductive areas on said first surface.

8. A semiconductor device as in claim 7 including a fifth conductive area on said second surface of said first member aligned with said fourth conductive area on said third surface and including an annular segment and two elongated segments, said elongated segments on said second surface being of the same width as the corresponding elongated segments on said third surface.

9. A semiconductor device as in claim 5 wherein one of said portions of said fourth conductive area is of less width than the corresponding aligned one of said first and second conductive areas on said first surface.

10. A semiconductor device comprising:

a first insulating member having first and second oppositely disposed surfaces, and a second insulating member having third and fourth oppositely disposed surfaces, said members being in second to third surface contacting relation, first and second spaced apart conductive areas on said first surface of said first member, third and fourth spaced apart conductive areas on said third surface of said second member, said fourth area including first and second portions in generally aligned relation with said first and second areas, respectively, on said first surface, one of said first and second portions being of less width than the corresponding aligned one of said first and second areas.

* * * * *